United States Patent [19]

Kobayashi et al.

[11] Patent Number: 5,576,643
[45] Date of Patent: Nov. 19, 1996

[54] DATA TRANSFER CIRCUIT DEVICE

[75] Inventors: Isamu Kobayashi; Yasuhiro Yamamoto, both of Kasugai, Japan

[73] Assignee: Fujitsu Limited, Kawasaki, Japan

[21] Appl. No.: 540,626

[22] Filed: Oct. 6, 1995

[30] Foreign Application Priority Data

Dec. 9, 1994 [JP] Japan ................. 6-306196

[51] Int. Cl.$^6$ ........................................ H03K 19/00
[52] U.S. Cl. ................. 326/94; 327/218; 327/98
[58] Field of Search .................. 326/93–98; 327/198, 327/202, 218

[56] References Cited

U.S. PATENT DOCUMENTS

| | | | |
|---|---|---|---|
| 5,036,221 | 7/1991 | Brucceleri | 326/94 |
| 5,122,694 | 6/1992 | Bradford | 326/94 |
| 5,233,617 | 8/1993 | Simmons | 327/218 |
| 5,239,206 | 8/1993 | Yanai | 327/202 |
| 5,410,550 | 4/1995 | Simmons | 327/218 |

Primary Examiner—Edward P. Westin
Assistant Examiner—Andrew Sanders
Attorney, Agent, or Firm—Armstrong, Westerman, Hattori, McLeland & Naughton

[57] ABSTRACT

A data transfer circuit device including a data transfer circuit, a latch control circuit and a data latch circuit. The data transfer circuit outputs data therefrom in response to an externally supplied transfer signal. The latch control circuit generates a data latch signal, based on the transfer signal and a latch control signal. The data latch circuit latches the data supplied from the data transfer circuit, based on the data latch signal, and outputs the latched data as output data. When the data is being switched, the latch control circuit prevents the data latch signal from being supplied to the data latch circuit.

7 Claims, 5 Drawing Sheets

5,576,643

DATA TRANSFER CIRCUIT DEVICE

BACKGROUND OF THE INVENTION

1. Field of the Invention

The present invention relates to a data transfer circuit provided in a semiconductor integrated circuit.

2. Description of the Related Art

A semiconductor integrated circuit is provided with various internal circuits. Data transfer between such internal circuits is performed based on transfer signals output from a data transfer control circuit. With acceleration of the operational speeds of semiconductor integrated circuits, it is required to increase the rate of data transfer. It is an utmost necessity to prevent erroneous data transfer operation caused by transfer control signals input at different timings.

FIG. 1 schematically shows a conventional data transfer device. The data transfer device formed in a semiconductor integrated circuit includes a data generating circuit 1 and a data latch circuit 2. The data generating circuit 1 receives an externally supplied transfer signal TR, and generates a data signal in response to the signal TR. The generated data is supplied to the data latch circuit 2. The data latch circuit 2 latches the data from the data generating circuit 1 in accordance with a data latch signal DL. The latched data is output therefrom as an output data Dout.

If a great discrepancy between timings of the transfer signal TR and the data latch signal DL occurs due to an increase in data transfer rate, it is possible that the data latch circuit 2 does not output an exact output data Dout. In other words, before the data input to the data latch circuit 2 from the data generating circuit 1 has been stabilized, a data latch signal DL may be input to the data latch circuit 2. In this case, an unstable data signal will unfortunately be latched by the latch circuit 2.

SUMMARY OF THE INVENTION

Accordingly, it is a primary objective of the present invention to provide a data transfer device which precisely controls data transfer while preventing unstable data from being latched.

To achieve the foregoing and other objects and in accordance with the purpose of the present invention, an improved data transfer device is provided.

The data transfer circuit device according to the present invention includes a data transfer circuit 6, a latch control circuit 7 and a data latch circuit 8 as shown in FIGS. 2A and 2B.

According to a first embodiment of the present invention, as shown in FIG. 2A, the data transfer circuit 6 outputs data D therefrom in response to an externally supplied transfer signal TR. The latch control circuit 7 generates a data latch signal DL, based on the transfer signal TR and a latch control signal LC. The data latch circuit 8 latches the data D supplied from the data transfer circuit 6, based on the data latch signal DL, and outputs the latched data as output data Dout. When the data D is being switched, the latch control circuit 7 prevents the data latch signal DL from being supplied to the data latch circuit 8.

According to a second embodiment of the present invention, as shown in FIG. 2B, the data transfer circuit 6 outputs data D therefrom in response to an externally supplied transfer signal TR. The latch control circuit 7 generates a data latch signal DL based on an externally supplied latch control signal LC and on the data D supplied from the data transfer circuit 6. The data latch circuit 8 latches the data D supplied from the data transfer circuit 6, based on the data latch signal DL, and outputs the latched data as output data Dout. When the input data D is being switched, the latch control circuit 7 prevents the data latch signal DL from being supplied to the data latch circuit 8.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 1:
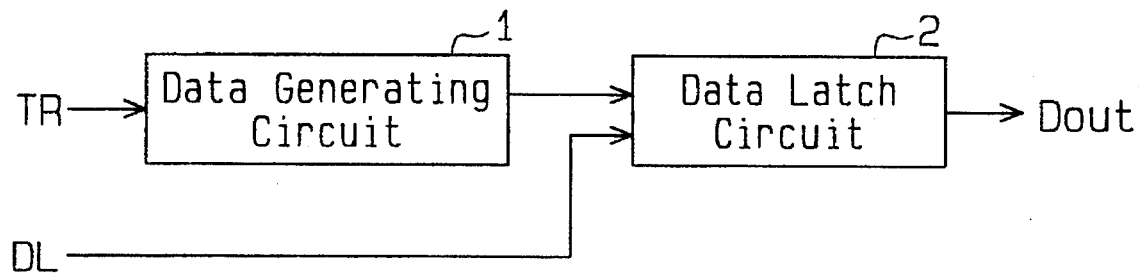
FIG. 1 is a circuit block diagram of a typical data transfer device.
Figure 2A:
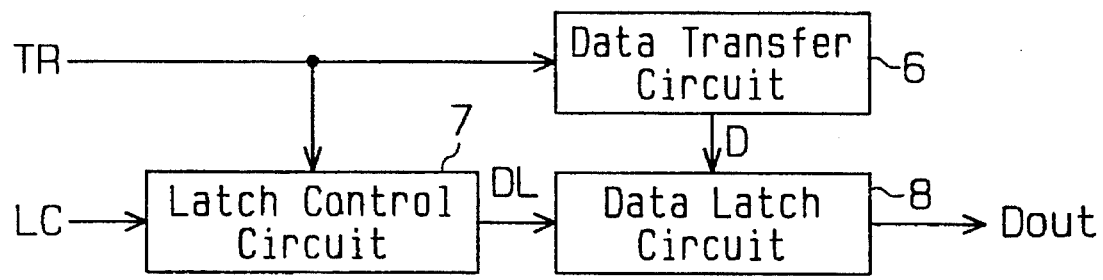
FIGS. 2A and 2B are schematic diagrams showing essential parts of data transfer devices according to the present invention.
Figure 2B:
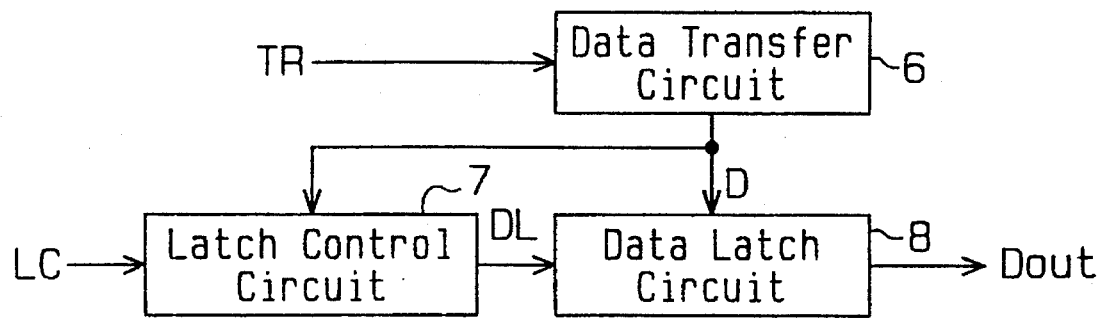
Figure 3:
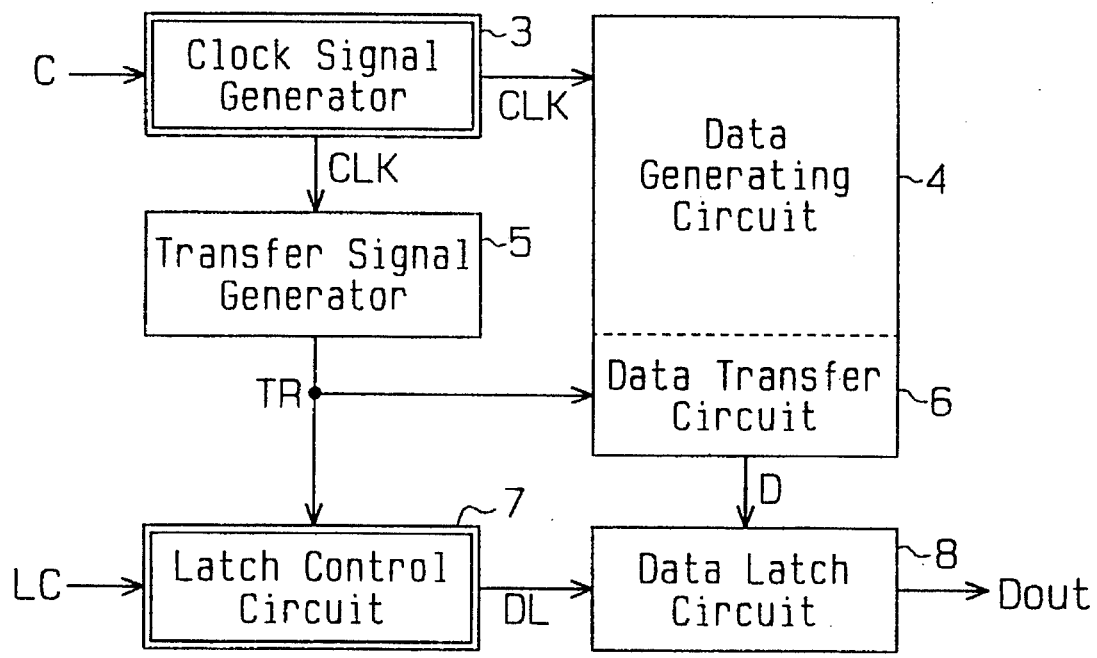
FIG. 3 is a circuit block diagram showing a data transfer device according to a first embodiment of the present invention.

A data transfer device in accordance with a first embodiment of the present invention will now be described referring to FIGS. 3, 4 and 5. As shown in FIG. 3, a clock signal generator 3, formed by an oscillation circuit, supplies a data generating circuit 4 and a transfer signal generator 5 with clock signals CLK in synchronism with an external clock signal C which is externally supplied thereto. The data generating circuit 4 generates data in response to the clock signal CLK, and provides its data to a data transfer circuit 6 incorporated in the data generating circuit 4. The transfer signal generator 5 generates a transfer signal TR based on the clock signal CLK, and provides the transfer signal TR to the data transfer circuit 6 and a latch control circuit 7. When the transfer signal goes high, the data transfer circuit 6 transfers data D from the data generating circuit 4 to a data latch circuit 8.

The latch control circuit 7 receives a latch control signal LC from an internal control circuit of the semiconductor integrated circuit (not shown). When the transfer signal TR and the latch control signal LC go high, the latch control circuit 7 supplies the data latch circuit 8 with a high-level data latch signal DL.

The data latch circuit 8 latches data D transferred from the data transfer circuit 6 in response to a rising of the data latch signal DL from low to high. The data latch circuit 8 provides the latched data as an output data Dout to an output circuit (not shown).

Figure 4:
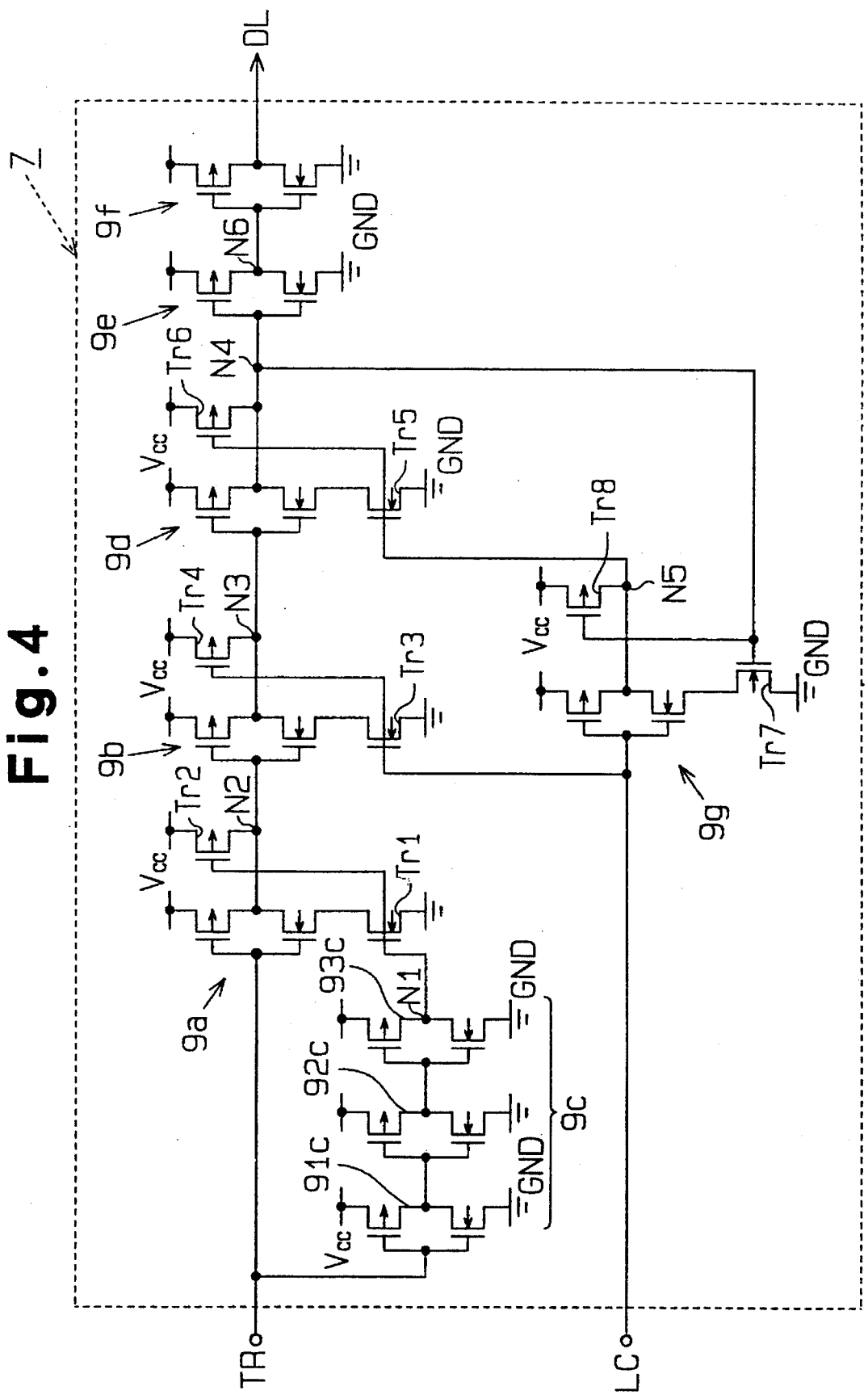
FIG. 4 is a circuit diagram of a latch control circuit.

FIG. 4 shows a detailed circuit configuration of the latch control circuit 7. An inverter 9a, formed by a pair of NMOS and PMOS transistors, has an input terminal receiving a transfer signal TR and an output terminal (i.e., node N2) connected to an input terminal of an inverter 9b.

An inverter circuit 9c, formed by three stages of series-connected inverters 91c, 92c and 93c, has an input terminal for receiving a transfer signal TR. An output terminal of the inverter circuit 9c, i.e., node N1 is connected to respective gates of an N-channel MOS transistor Tr1 and a P-channel MOS transistor Tr2.

In the first inverter 91c of the inverter circuit 9c, the gate width of its P-channel MOS transistor is substantially ten times as large as the gate width of its N-channel MOS transistor. In the second inverter 92c of the inverter circuit 9c, the gate width of its N-channel MOS transistor is substantially ten times as large as the gate width of its P-channel MOS transistor. In the third inverter 93c of the inverter circuit 9c, the gate width of its P-channel MOS transistor is substantially ten times as large as the gate width of its N-channel MOS transistor. Accordingly, as shown in FIG. 5, a delay time t2, specified as a time period from a rising of the transfer signal TR input to the inverter circuit 9c to a falling of the output signal at the node N1, is sufficiently longer than a delay time t3 specified as a time period from a subsequent falling of the transfer signal TR to a subsequent rising of the output at the node N1.

As shown in FIG. 4, the transistor Tr1 is connected between the ground GND and the source of the N-channel MOS transistor of the inverter 9a. The transistor Tr2 is connected between the node N2 and a power supply Vcc.

An inverter 9b, formed by a pair of NMOS and PMOS transistors, has an output terminal (i.e., node N3) connected to an input terminal of an inverter 9d. An output terminal of the inverter 9d, i.e., node N4 is connected to an input terminal of an inverter 9e.

In the inverter 9e, the gate width of its P-channel MOS transistor is substantially ten times as large as the gate width of its N-channel MOS transistor. Accordingly, the threshold voltage of the inverter 9e is set relatively high. As a result, the inverter 9e can output a low-level signal after the voltage potential of the node N4 has gone high. This prevents the inverter 9e from erroneously outputting a low-level signal by being adversely influenced by noise.

An output terminal of the inverter 9e, i.e., node N6 is connected to an input terminal of an inverter 9f. The data latch signal DL is produced at an output terminal of the inverter 9f.

Each of an N-channel MOS transistor Tr3 and a P-channel MOS transistor Tr4 has a gate for receiving a latch control signal LC. The transistor Tr3 is connected between the ground GND and the source of the N-channel MOS transistor of the inverter 9b. The transistor Tr4 is connected between the node N3 and the power supply Vcc.

The latch control signal LC is supplied to an input terminal of an inverter 9g. An output terminal of the inverter 9g, i.e., node N5 is connected to the respective gates of a N-channel MOS transistor Tr5 and a P-channel MOS transistor Tr6. The transistor Tr5 is connected between the ground and the source of the N-channel MOS transistor of the inverter 9d. The transistor Tr6 is connected between the node N4 and the power supply Vcc.

The node N4 is connected to the respective gates of an N-channel MOS transistor Tr7 and a P-channel MOS transistor Tr8. The transistor Tr7 is connected between the ground and the source of the N-channel MOS transistor of the inverter 9g. The transistor Tr8 is connected between the node N5 and the power supply Vcc.

Figure 5:
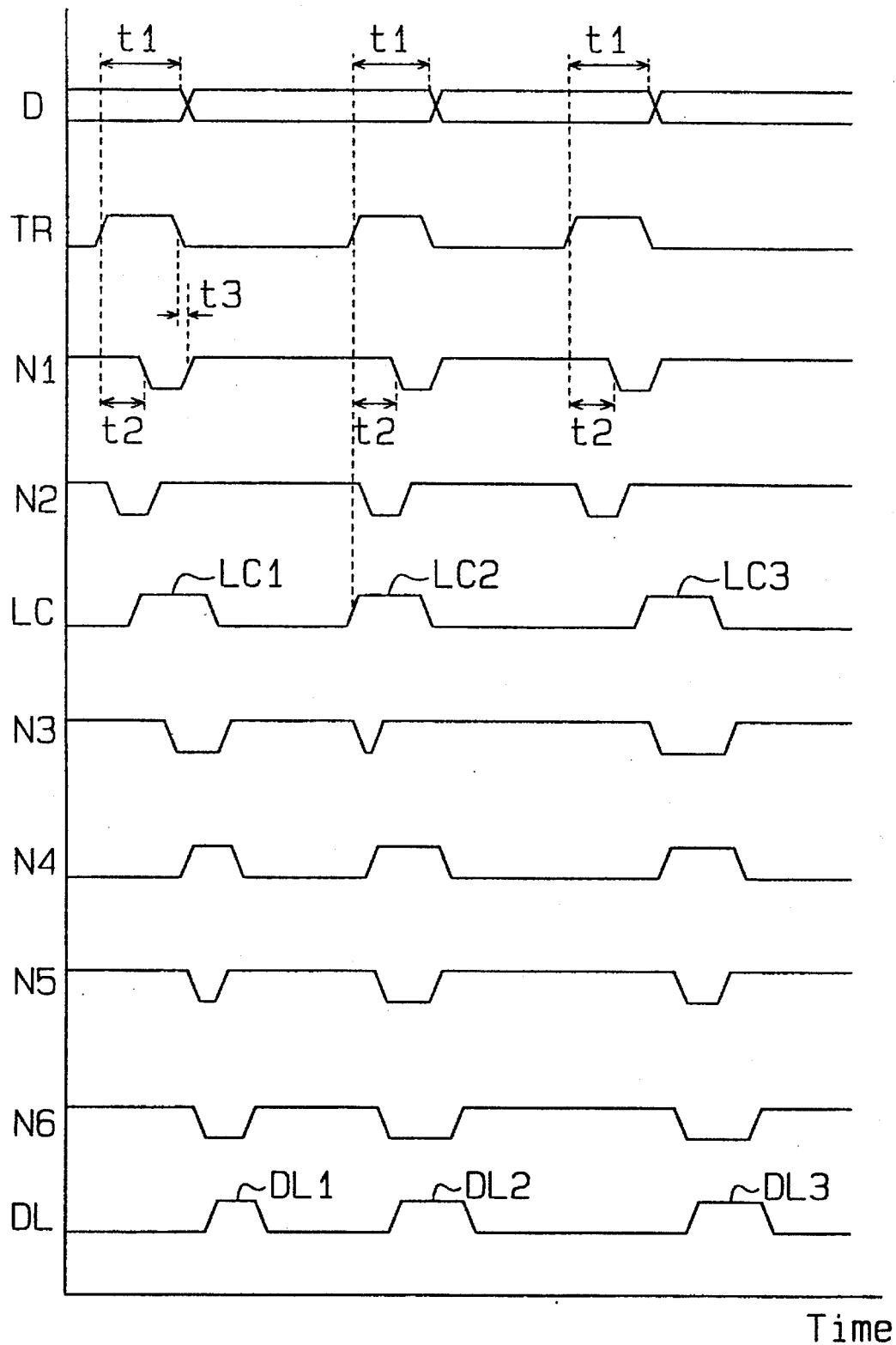
FIG. 5 is a timing waveform diagram of the operation of the latch control circuit.

Data D, supplied from the data transfer circuit 6 to the data latch circuit 8, is switched after a predetermined time period t1 has elapsed from a rising of the transfer signal TR, as shown in FIG. 5.

With the transfer signal TR and the latch control signal LC both low, the data latch signal DL output from the latch control circuit 7 is kept low. Specifically, with the transfer signal TR set low, the node N1 is set high. Then, the transistor Tr1 turns ON, the transistor Tr2 turns OFF and the voltage potential of the node N2 is set high by the inverter 9a.

When the latch control signal LC is set low, the transistor Tr3 turns OFF and the transistor Tr4 turns ON, thereby setting the node N3 high. Further, the inverter 9g allows the node N5 to be set high, so that the transistor Tr5 turns ON and the transistor Tr6 turns OFF. Then, the node N4 is set low by the inverter 9d, so that the transistor Tr7 turns OFF and the transistor Tr8 turns ON. The node N6 is set high, and the data latch signal DL goes low.

Firstly, an explanation will be given of a case where the transfer signal TR goes high and thereafter a latch signal LC1 goes high.

When the transfer signal TR goes high, the voltage potential of the node N2 is set low by the inverter 9a. When a delay time period t2 has elapsed from the input of the high transfer signal TR, the potential of the node N1 falls and goes low. Then, the transistor Tr1 turns OFF and the transistor Tr2 turns ON, so that the potential of the node N2 is set high again.

Further, when the transfer signal TR goes low, the potential of the node N1 is set high after a delay time period t3 has elapsed from the falling of the signal TR. This permits the node N1 to catch a next rising of the transfer signal TR.

With the potential of the node N2 low, when a latch control signal LC1 goes high, the transistor Tr3 turns ON and the transistor Tr4 turns OFF. As a result, the node N3 is kept high, due to the operation of the inverter 9b with the node N2 low.

When the potential of the node N2 goes high, the potential of the node N3 goes low and the node N4 is set high. Then, the transistor Tr7 turns ON and the transistor Tr8 turns OFF. Therefore, the node N5 is set low, based on the operation of the inverter 9g. Setting the node N4 high causes the node N6 to go low and the data latch signal DL1 to go high.

Subsequently, when the latch control signal LC1 goes low, the transistor Tr4 turns ON. As a result, the potentials of the nodes N3 and N5 are set high, the potential of the node N4 is set low, the potential of the node N6 is set high, and the data latch signal DL1 goes low.

As is apparent from the above-mentioned circuit operation, the inverters 9a and 9c and the transistors Tr1 and Tr2 form a mask signal generating circuit, which generates a mask signal at node N2 which sets N2 low only during the delay time period t2 starting from a rising of the transfer signal TR and caused by the inverter 9c. Inverter 9a in conjunction with TR1 and TR2 produce a NAND signal of the delay signal (N1) and the transfer signal (TR), as illustrated by the waveforms in FIG. 5.

Further, the inverters 9b, 9d and 9g and the transistors Tr3 through Tr8 form an output synthesizer circuit. The output synthesizer circuit operates such that the signal at the node N3 goes low in response to a rising of the signal at the node N2 only if LC is high since N3 is otherwise held high by TR4 when LC is low. Further, the output synthesizer circuit operates such that, when the latch control signal LC goes high with the node N2 high, the potential of the node N3 falls in response to the rising of the signal LC. In other words, the output signal synthesizer generates a NAND signal at N3 from N2 (mask generator output) and LC. The NAND signal of N3 thereafter determines the leading edge the ultimately generated data latch signal, as illustrated by the waveforms of FIG. 5.

The inverters 9e and 9f form a waveform shaping circuit. Since the gate width of the PMOS transistor of the inverter 9e is enlarged, the waveform shaping circuit * outputs a high-level data latch signal DL when the potential of the node N4 has firmly become high.

When the transfer signal TR and the latch control signal LC1 rise at the timings as described above, the potential of the node N3 falls in response to a rising of the potential of the node N2 since inverter 9b is enabled by TR3 and TR4 is off. Based on the falling of the potential at the node N3, the data latch signal DL1 goes high.

Accordingly, the data latch signal DL1 goes high after the switching of the data D, due to the delay time period t2 defined by the inverter 9c. Consequently, the data latch circuit 8 can latch input data D and produce output signal Dout, after the input data D has stabilized. This allows the data latch circuit 8 to output accurate data D after it has been switched.

Next, an explanation will be given of a case where the transfer signal TR and a latch control signal LC2 rise in synchronism with each other.

When a latch control signal LC2 rises in synchronism with a rising of the transfer signal TR, the rising of the latch control signal LC2 is prior to a falling of the potential of the node N2. The potential of the node N3 falls in response to the rising of the latch control signal LC2. Then, the potential of the node N4 rises and the potential of the node N6 falls, so that a data latch signal DL2 goes high.

Thus, the data latch signal DL2 goes high before data D is switched. Consequently, the data latch circuit 8 outputs the signal Dout after latching the stabilized data D before data switching. This allows accurate data D to be output from the data latch circuit 8.

Next, an explanation will be given of a case where the potential of the node N2 falls in response to a rising of the transfer signal TR, the node N2 goes high and thereafter a high-level latch control signal LC3 is supplied.

When the latch control signal LC3 goes high, the potential of the node N3 falls in response to a rising of the control signal LC3 because N2 is low. When the potential of the node N4 rises based on the falling of the node N3's potential, the potential of the node N6 falls and a data latch signal DL3 goes high.

Thus, the data latch signal DL3 goes high after the switching of data D. As a result, the data latch circuit 8 outputs the output signal Dout after latching the stabilized data D after data switching. This allows accurate data D to be output from the data latch circuit 8.

According to the data transfer device of this embodiment, a data latch signal DL, based on a latch control signal LC, is not provided from the latch control circuit 7 to the data latch circuit 8, when the input data D to the data latch circuit 8 is being switched. Therefore, the data latch circuit 8 can latch and output accurate data D.

Second Embodiment

Figure 6:
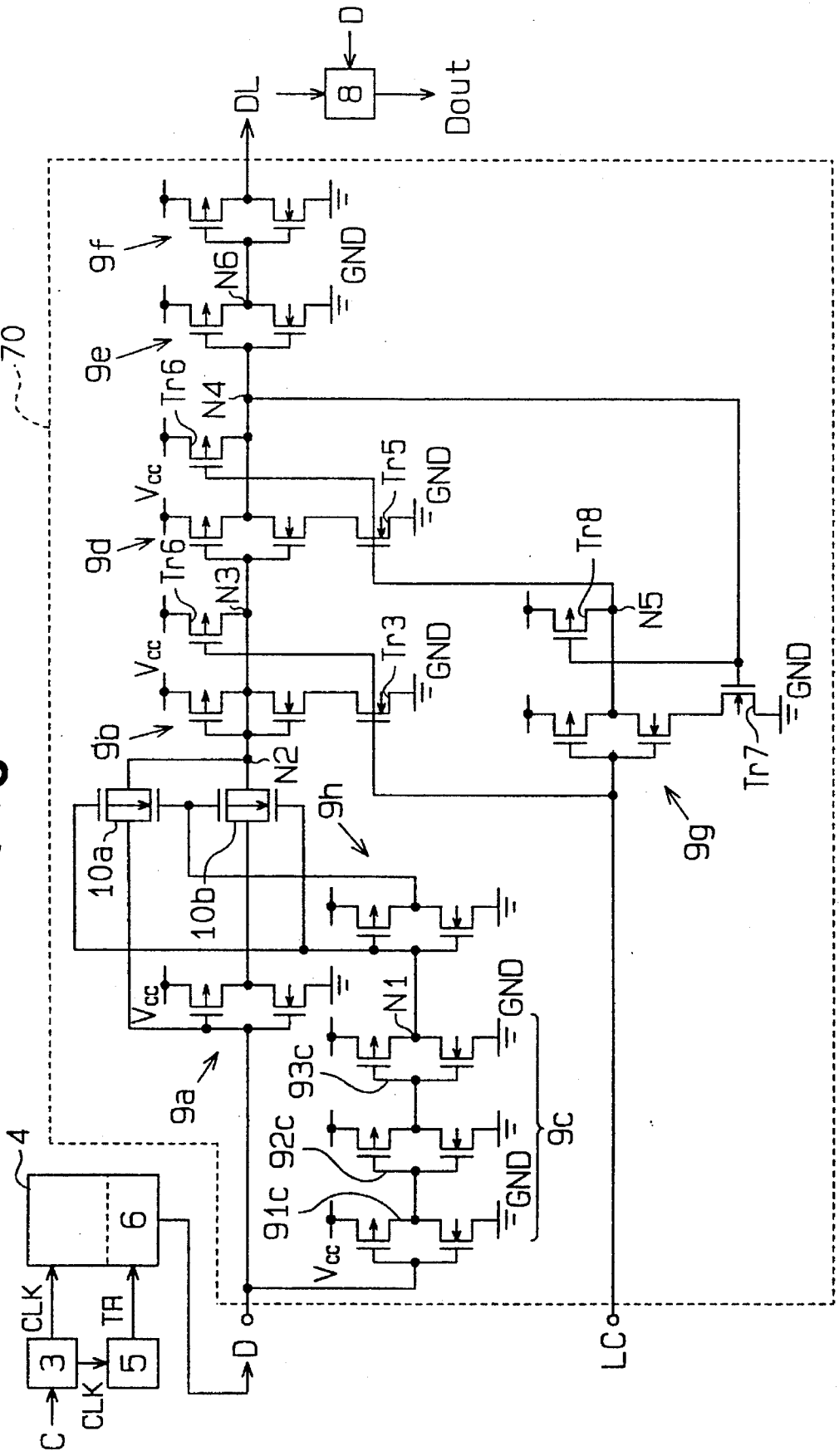
FIG. 6 is a circuit diagram of a latch control circuit according to a second embodiment of the present invention.

FIG. 6 shows a latch control circuit 70 in accordance with a second embodiment of the present invention. In this embodiment, an inverter 9h and transfer gates 10a and 10b are provided in place of the transistors Tr1 and Tr2 of the latch control circuit 7 in the first embodiment.

The output signal of the inverter circuit 9c is input to the inverter 9h. The output signal of the inverter circuit 9c is also provided to the gate of the P-channel MOS transistor of the transfer gate 10a and the gate of the N-channel MOS transistor of the transfer gate 10b. The output signal of the inverter 9h is provided to the gate of the N-channel MOS transistor of the transfer gate 10a and the gate of the P-channel MOS transistor of the transfer gate 10b. Thus, the inverters 9a, 9c and 9h and the transfer gates 10a and 10b form an exclusive OR circuit.

Each of the inverters 9a and 9c receives not transfer signal TR but data D output from the data transfer circuit 6 of the data generating circuit 4.

When the potential level of the data signal D is changed, the latch control circuit 70 produces, at the node N2, a low-level signal having the pulse width in accordance with the delay time defined by the inverter circuit 9c, as in the first embodiment. When data is being switched, the data latch signal DL does not go high. After the delay time based on the inverter circuit 9c has elapsed, the input data D to the data latch circuit 8 is stabilized. Thereafter the data latch signal DL goes high.

With the data stabilized, the data latch signal DL goes high in response to a rising of the latch control signal LC.

According to the data transfer device having the data latch control circuit 70, when the input data D to the data latch circuit 8 is being switched, the data latch signal DL to be input to the data latch circuit 8 does not go high. As a result, the data D can be stably output as an output signal Dout.

Figure 7:
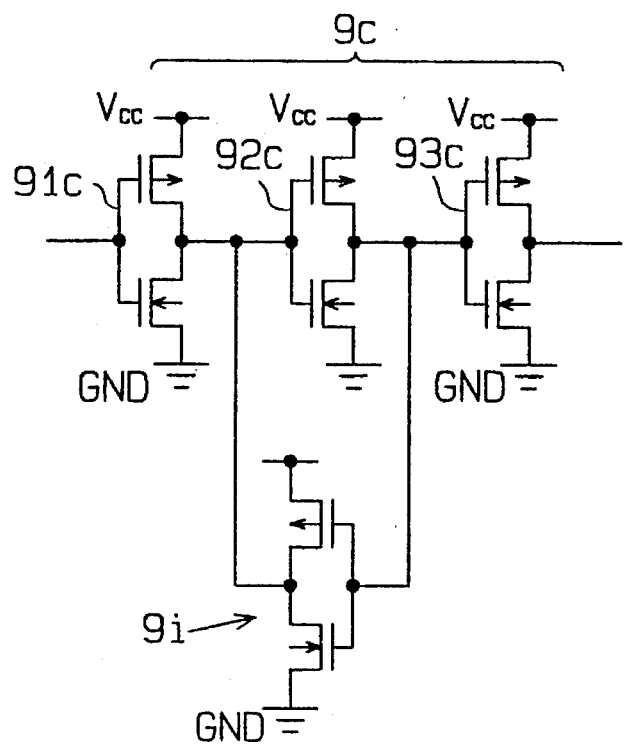
FIG. 7 is a circuit diagram of a modification of the latch control circuit shown in FIG. 6.

FIG. 7 shows a modification of the inverter circuit 9c employed in the second embodiment. This inverter circuit 9c is further provided with a fourth inverter 9i. The inverter 9i has an input terminal connected to the output terminal of the second inverter 92c and an output terminal connected to the input terminal of the second inverter 92c. Connecting the fourth inverter 9i to the second inverter 92c produces a Schmitt circuit within the inverter circuit 9c. Accordingly, the inverter circuit 9c can switch the potential level of its output signal, after the input data D has been completely switched. Therefore, the data latch signal DL of the latch control circuit can go high after the data D has been switched.

Although only two embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. A data transfer circuit unit comprising:

a data transfer circuit for outputting transfer data therefrom in response to a transfer signal externally supplied thereto;

a latch control circuit for generating a data latch signal based on the transfer signal and a latch control signal, which are externally supplied thereto; and a data latch circuit for latching the transfer data supplied from said data transfer circuit, based on the data latch signal from said latch control circuit, and for thereafter outputting the latched transfer data as output data, wherein when the transfer data to said data latch circuit is being switched, said latch control circuit prevents the data latch signal from being supplied to said data latch circuit.

2. The data transfer circuit unit according to claim 1, wherein said latch control circuit includes:

a mask signal generator responsive to the transfer signal, for generating a mask signal having a pulse length which at least in part determines a time delay between the transfer signal and the generation of said data latch signal; and an output synthesizer circuit, coupled to said mask signal generator, for generating a first NAND signal of the mask signal and the latch control signal, which first NAND signal is thereafter used in determining a leading edge of said data latch signal.

3. The data transfer circuit unit according to claim 2, wherein said mask signal generator includes a delay circuit supplied with the transfer signal and wherein said mask signal generator generates said mask signal as a second NAND signal of the transfer signal and a delay signal produced by said delay circuit based on the transfer signal.

4. The data transfer circuit unit according to claim 2, wherein said latch control circuit further includes a waveform shaping circuit coupled to said output synthesizer circuit.

5. The data transfer circuit unit comprising:

a data transfer circuit for outputting transfer data therefrom in response to a transfer signal externally supplied thereto;

a latch control circuit for generating a data latch signal based on an externally supplied latch control signal and on the transfer data supplied from said data transfer circuit; and a data latch circuit for latching the transfer data supplied from said data transfer circuit, based on the data latch signal from said latch control circuit, and for thereafter outputting the latched data as output data, wherein when the transfer data to said data latch circuit is being switched, said latch control circuit prevents the data latch signal from being supplied to said data latch circuit, wherein said latch control circuit includes:

a mask signal generator for generating a mask signal having a predetermined pulse length, based on the transfer data supplied from said data transfer circuit, said mask signal at least in part determining a time delay between the transfer signal and the generation of said data latch signal; and an output synthesizer circuit, coupled to said mask signal generator, for generating a signal used in determining a leading edge of said data latch signal, based on the mask signal and on the latch control signal.

6. The data transfer circuit unit according to claim 5, wherein said mask signal generator includes a delay circuit supplied with a signal indicative of the data from said data transfer circuit; and wherein said mask signal generator generates an Exclusive OR signal of the data signal and a delay signal produced by said delay circuit based on the data signal.

7. The data transfer circuit unit according to claim 5, wherein said latch control circuit further includes a waveform shaping circuit coupled to said output synthesizer circuit.

\* \* \* \* \*